(12) United States Patent
Karaki

(10) Patent No.: US 7,479,986 B2
(45) Date of Patent: Jan. 20, 2009

(54) IMAGING APPARATUS INCLUDING A COOLED IMAGING ELEMENT WHICH IS SHIFTED TO PERFORM HIGH-DEFINITION IMAGING

(75) Inventor: Kenji Karaki, Ina (JP)

(73) Assignee: Olympus Optical Co., Ltd., Tokyo (JP)

( * ) Notice: Subject to any disclaimer, the term of this patent is extended or adjusted under 35 U.S.C. 154(b) by 1197 days.

(21) Appl. No.: 10/669,522

(22) Filed: Sep. 24, 2003

(65) Prior Publication Data

US 2004/0075870 A1 Apr. 22, 2004

(30) Foreign Application Priority Data

Sep. 27, 2002 (JP) ............................. 2002-283566

(51) Int. Cl.
*H04N 5/228* (2006.01)
*H01J 7/24* (2006.01)
*H01J 40/14* (2006.01)
*H01L 23/34* (2006.01)
*H05K 7/20* (2006.01)

(52) U.S. Cl. .................. 348/208.99; 250/238; 257/712; 361/709

(58) Field of Classification Search ................. 348/373, 348/374, 208.99, 208.4; 250/238, 239; 257/467, 257/712, 714, 717
See application file for complete search history.

(56) References Cited

U.S. PATENT DOCUMENTS 5,043,845 A * 8/1991 McDermott et al. ......... 361/705

| 5,216,250 | A | * | 6/1993 | Pellegrino et al. | ...... 250/370.09 |
| 5,508,740 | A | * | 4/1996 | Miyaguchi et al. | .......... 348/244 |
| 6,307,590 | B1 | * | 10/2001 | Yoshida | ....................... 348/340 |
| 6,341,067 | B1 | * | 1/2002 | Conder | ......................... 361/719 |
| 6,930,708 | B1 | * | 8/2005 | Sato et al. | .............. 348/208.99 |
| 6,940,542 | B2 | * | 9/2005 | Kitazawa et al. | ....... 348/208.99 |

FOREIGN PATENT DOCUMENTS

| JP | 06-045571 A | 2/1994 |
| JP | 11-275408 | 10/1999 |
| JP | 2002-247594 A | 8/2002 |
| JP | 2003-098059 A | 4/2003 |

OTHER PUBLICATIONS

Japanese Office Action (and English translation thereof) dated Feb. 19, 2008, issued in a counterpart Japanese Application.
Japanese Office Action (and English translation thereof) dated Feb. 19, 2008, issued in a counterpart Japanese Application.

* cited by examiner

*Primary Examiner*—Lin Ye
*Assistant Examiner*—Kelly L. Jerabek
(74) *Attorney, Agent, or Firm*—Frishauf, Holtz, Goodman & Chick, P.C.

(57) ABSTRACT

A highly thermal conductive member is filled in a gap between a base portion and a movable portion of a spring stage in an image shift type imaging apparatus. Heat from a heat generating surface of a cooling element is conducted from the movable portion to the base portion through the highly thermal conductive member, and it is further conducted to an inner lid and discharged to the outside of an imaging apparatus housing.

6 Claims, 4 Drawing Sheets

US 7,479,986 B2

IMAGING APPARATUS INCLUDING A COOLED IMAGING ELEMENT WHICH IS SHIFTED TO PERFORM HIGH-DEFINITION IMAGING

CROSS-REFERENCE TO RELATED APPLICATIONS

This application is based upon and claims the benefit of priority from the prior Japanese Patent Application No. 2002-283566, filed Sep. 27, 2002, the entire contents of which are incorporated herein by reference.

BACKGROUND OF THE INVENTION

1. Field of the Invention

The present invention relates to an imaging apparatus with a high resolution using, e.g., a pixel shift mode.

2. Description of the Related Art

In recent years, in various kinds of fields, there has been increased a demand for obtaining a high-sensitive high-definition image by an imaging apparatus using a fixed imaging element (which will be referred to as a CCD hereinafter). At present, the number of pixels realized by an imaging device such as a fixed imaging element is approximately several-million pixels. In order to obtain image data with ten-million or more pixels, a pixel shift mode disclosed in, e.g., Jpn. Pat. Appln. KOKAI Publication No. 11-275408 is used.

The pixel shift mode performs imaging a plurality of number of times by slightly moving a CCD by a micro-motion mechanism employing a piezoelectric actuator. The micro-motion mechanism used in the pixel shift mode is disclosed in, e.g., Jpn. Pat. Appln. KOKAI Publication No. 2003-98059.

On the other hand, high sensitivity for fluorescent observation shooting is demanded in a digital camera for a microscope or the like. In order to realize a high-sensitivity camera, the signal-to-noise ratio is improved by, e.g., cooling the CCD. For cooling the CCD, there is used a so-called cooled CCD technique which directly or indirectly cools the CCD by utilizing a cooling element such as a Peltier element.

In an imaging apparatus using a micro-motion mechanism utilized in the pixel shift mode, not only high-definition image data is obtained, but high-sensitivity image data is also acquired. In such a case, a possibility of using the cooled CCD technique in the imaging apparatus is high. When the cooled CCD technique is used, however, a problem of radiation performance occurs in the imaging apparatus.

BRIEF SUMMARY OF THE INVENTION

According to a main aspect of the present invention, there is provided an imaging apparatus comprising: a plate type fixed portion; a spring portion formed by notching the inside of the fixed portion; a movable portion supported in the fixed portion so as to be capable of slightly moving through the spring portion; a micro-motion element which slightly moves the movable portion; an imaging element provided on the movable portion; a cooling element having a cooling surface thereof being in contact with a back side of the imaging element through a heat sink; a highly thermal conductive member interposed in a gap between the fixed portion and the movable portion; and a housing which accommodates therein the fixed portion, the movable portion, the micro-motion element, the imaging element, the cooling element and the highly thermal conductive member, and discharges heat conducted from a heat generating surface of the cooling element through the movable portion and the highly thermal conductive member.

According to a main aspect of the present invention, there is provided an imaging apparatus comprising: a plate type fixed portion; a spring portion formed by notching the inside of the fixed portion; a movable portion supported in the fixed portion so as to be capable of slightly moving through the spring portion; a micro-motion element which slightly moves the movable portion; an imaging element provided on the movable portion; a cooling element having a cooling surface thereof being contact with a back side of the imaging element through a heat sink; a highly thermal conductive member interposed between the movable portion and the housing; and a housing which accommodates therein the fixed portion, the movable portion, the micro-motion element, the imaging element, the cooling element and the highly thermal conductive member, and discharges heat conducted from a heat generating surface of the cooling element through the movable portion and the highly thermal conductive member.

According to a main aspect of the present invention, there is provided an imaging apparatus comprising: a plate type fixed portion; a spring portion being formed by notching the inside of the fixed portion; a movable portion which is supported in the fixed portion so as to be capable of slightly moving through the spring portion; a micro-motion element which slightly moves the movable portion; an imaging element provided on the movable portion; a cooling element having a cooling surface thereof being in contact with a back side of the imaging element through a heat sink; a highly thermal conductive member which cuts across a gap between the movable portion and the fixed portion and connects the movable portion and the fixed portion with each other; and a housing which accommodates therein the fixed portion, the movable portion, the micro-motion element, the imaging element, the cooling element and the highly thermal conductive member, and discharges heat conducted from a heat generating surface of the cooling element through the movable portion and the highly thermal conductive member.

DETAILED DESCRIPTION OF THE INVENTION

Figure 1:
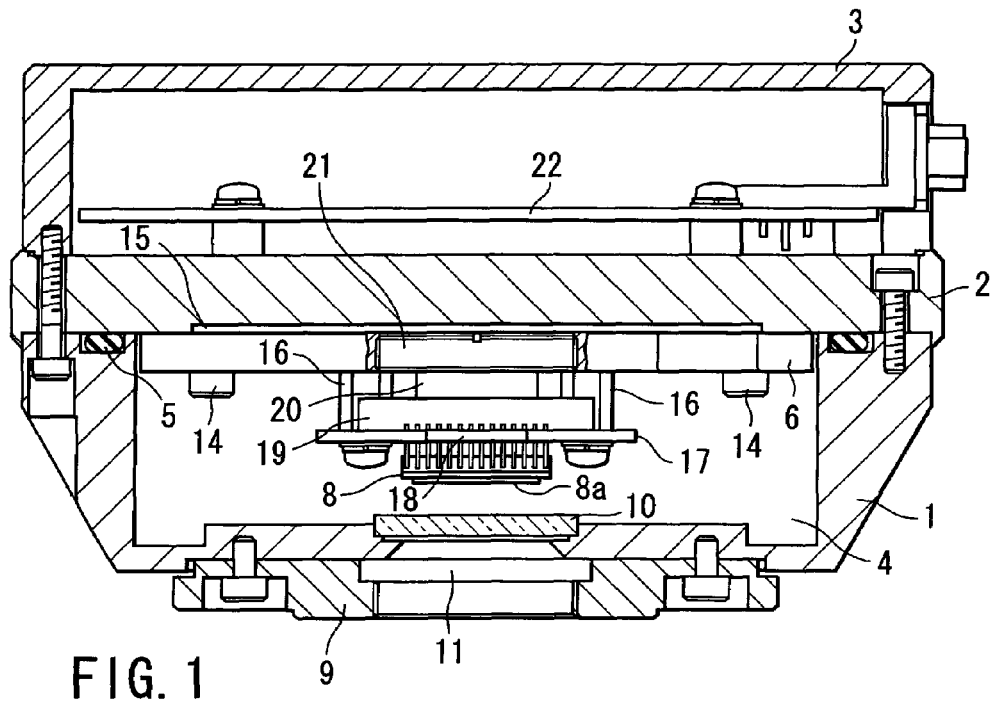
FIG. 1 is a cross-sectional view showing a first embodiment of an imaging apparatus according to the present invention.

A first embodiment according to the present invention will now be described with reference to the accompanying drawings. It is to be noted that like reference numerals denote parts equal to those in FIGS. 8 and 9, thereby eliminating their detailed explanation.

Figure 2:
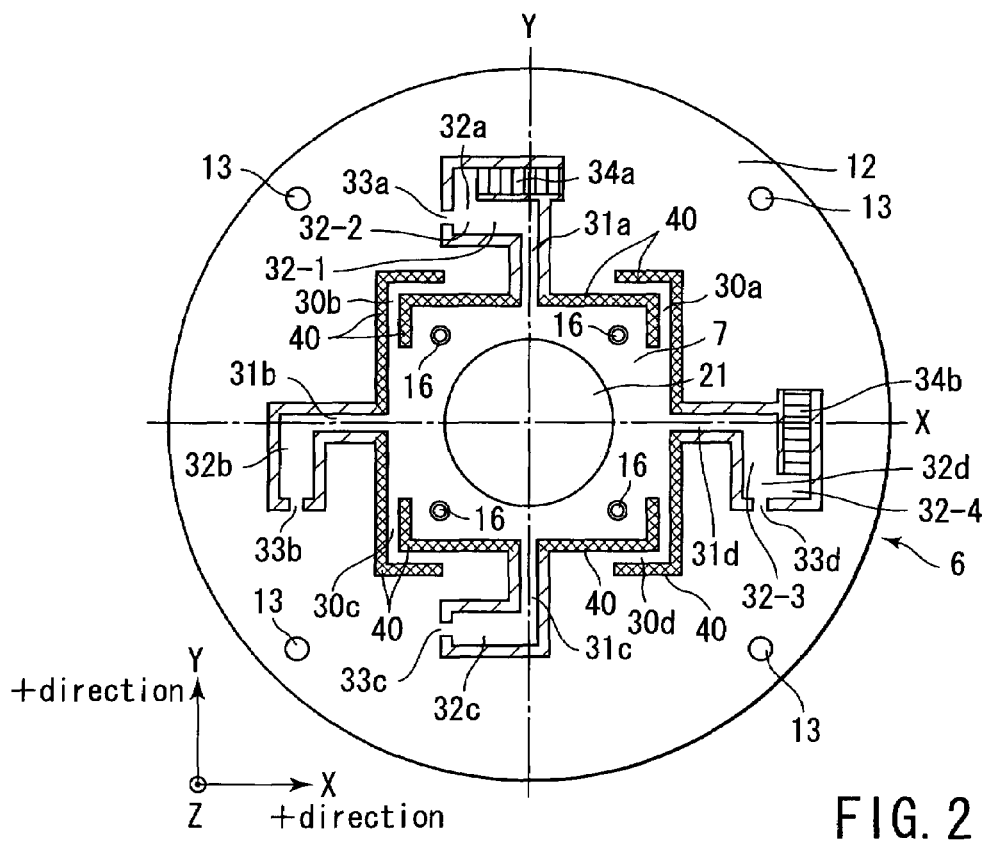
FIG. 2 is a block diagram showing a spring stage in the same apparatus.

FIGS. 1 and 2 are structural views showing a housing of an imaging apparatus. FIG. 1 is a cross-sectional view, and FIG. 2 is a block diagram of a spring stage. The housing of the imaging apparatus consists of a main body, an inner lid 2 and an upper lid 3. A space 4 formed by the main body 1 and the inner lid 2 is completely sealed so as not to leak air or the like through an O ring 5. The space 4 is filled with, e.g., very dry air or an inert gas such as nitrogen. A micro-motion mechanism (which will be referred to as a spring stage hereinafter) 6 is provided in the space 4.

A CCD 8 is mounted on a movable portion 7 of the spring stage 6. The CCD 8 is, e.g., a cooled CCD. A C mount 9 is disposed to the main body 1 opposed to an imaging surface 8a of the CCD 8 in the space 4. An optical lens 10 is attached to the main body 1 by using the C mount 9. The optical lens 10 takes in an image to be picked up, and forms an image on the imaging surface 8a of the CCD 8. A dustproof glass 11 is fixed from the inner side of an upper portion of the C mount 9 by bonding or the like. As a result, the dustproof glass 11 seals the space 4.

The spring stage 6 shown in FIG. 2 is fixed to a lower portion of the inner lid 2. The spring stage 6 is screwed at the lower portion of the inner lid 2 through, e.g., four holes 13 provided to a base portion 12 by each screw 14.

A recess concave portion 15 is provided on a surface of the inner lid 2 on the spring stage 6 side. A position at which the recess concave portion 15 is provided corresponds to a part where the movable portion 7 in the spring stage 6 is formed. As a result, the spring stage 6 and the inner lid come into contact with each other on a slight surface from the outer periphery of the base portion 12. A part in the spring stage 6 where the movable portion 7 is formed does not directly come into contact with the inner lid 2. It is to be noted that bringing the part of the movable portion 7 into contact with the inner lid 2 disables the accurate micro-motion of the movable portion 7, or completely disables the same.

Respective columns 16 are provided at four corners in the movable portion 7 of the spring stage 6 by using screws. A substrate 17 is supported by each column. The substrate mounts a CCD 8.

A hole 18 is opened at a part in the substrate 17 corresponding to the CCD 8. A heat sink 19 is in contact with a back side of the CCD 8 through the hole 18. A surface of the heat since 19 opposite to a contact surface with the CCD 8 is in contact with a cooling surface of a cooling element 20. The heat conductivity is enhanced by coating, e.g., a thermal conductive grease to the contact surface between the heat sink 19 and the CCD 8 and the contact surface between the heat sink 19 and the cooling element 20.

In regard to attachment of the CCD 8, the heat sink 19 and the cooling element 20, the CCD 8, the heat sink 19 and the cooling element 20 are arranged, and an adjustment screw 21 is then screwed to the CCD 8 side. The adjustment screw 21 is screwed until the CCD 8, the heat sink 19 and the cooling element 20 are respectively assuredly appressed.

A substrate 22 is provided to the upper portion of the inner lid 2. On the substrate 22 is formed, e.g., a circuit used to obtain image data by processing an output signal from the CCD 8. The upper lid 3 is fixed to the upper portion of the inner lid 2. A connector connected to the substrate 22 is led out from the upper lid 3 to the outside of the imaging apparatus housing. To this connector is connected, e.g., a personal computer which is used to, e.g., control the imaging apparatus or transfer picked-up image data.

In order to cool the CCD 8 by using the cooling element 20 such as a Peltier element, the heat sink 19 is appressed against the back side of the CCD 8, and the cooling element 20 is appressed against the heat sink 18. The cooling element 20 has a cooling surface and a heat generating surface. The cooling surface of the cooling element 20 is appressed against the heat sink 18, and the heat generating surface of the same is appressed against the movable portion 7 side.

When a voltage is applied to the cooling element 20, the CCD 8 is cooled from the cooling surface of the cooling element 20 through the heat sink 18. On the contrary, the movable portion 7 is heated by the heat generating surface of the cooling element 20.

The base portion 12 shown in FIG. 2 has a plate-like shape and consists of a plate material having a thickness of, e.g., approximately 5 mm. In the base portion 12, respective flat springs 30a to 30d and respective drive springs 31a to 31d and the like are integrally formed by notching the hatched part in the drawing by, e.g., a wire electric discharge machine. It is to be noted that the hatched part in the drawing corresponds to the part notched by the wire electric discharge machine.

The movable portion 7 has, e.g., the CCD 8 mounted thereon as an imaging device. The movable portion 7 is formed at a substantially central portion of the base portion 12. The four corners of the movable portion 7 are connected to the base portion 1 through the four flat springs 30a to 30d.

The respective flat springs 30a to 30d are formed when two notch parts are notched in parallel to each other in the L shape. A width of each of the flat springs 30a to 30d is formed thin so as to act as a spring in directions of an axis X and an axis Y. It is to be noted that the axis X and the axis Y are orthogonal to each other.

On the spring stage 6, the respective drive springs 31a to 31d are formed on the respective axes in the directions of the axes X and Y running through the central portion of the movable portion 7. Each of the drive springs 31a to 31d is connected to one end of each of arm portions 32a to 32d. Each of the arm portions 32a and 32d is formed into the L shape bent at substantially 90°.

The arm portion 32a integrally forms an arm portion piece 32-1 which is bent at substantially 90° with respect to the drive spring 31a and extends in a direction −X and an arm portion piece 32-2 which is bent at substantially 90° with respect to the arm portion piece 32-1 and extends in a direction +X.

The arm portion 32d integrally forms an arm portion piece 32-3 which is bent at substantially 90° with respect to the drive spring 31d and extends in a direction of −Y and an arm portion piece 32-4 which is bent at substantially 90° with respect to the arm portion piece 32-3 and extends in a direction of +X.

Each of the arm portions 32b and 32c is formed into a plate-like shape.

Respective hinge portions 32a to 33d are provided at end portions of the respective arm portions 32a to 32d.

Each of piezoelectric actuators 34a and 34b is provided at the other end portion (in an L-shaped opening) of each of the arm portions 32a and 32d. The piezoelectric actuator 34a comes into contact with the arm portion piece 32-2 and operates to expand and contract in the direction of the axis X. The arm portion 32a swivels with the hinge portion 33a as a supporting point by the expansion and contraction operation of the piezoelectric actuator 34a.

The piezoelectric actuator 34b comes into contact with the arm portion piece 32-4, and operates to expand and contract in the direction of the axis Y. The arm portion 32d swivels with the hinge portion 33d as a supporting point by the expansion and contraction operation of the piezoelectric actuator 34b.

The expansion and contraction direction of each of the piezoelectric actuators 34a and 34b is orthogonal to the moving direction of the movable portion 7.

The respective piezoelectric actuators 34a and 34b operate to expand and contract in accordance with a value of a voltage applied from an actuator control circuit.

A highly thermal conductive member 40 is filled in a gap between the base portion 12 and the movable portion 7. The highly thermal conductive member 40 is indicated by the lattice hatching in the drawing. The highly thermal conductive member 40 is, e.g., a highly thermal conductive grease or a highly thermal conductive gel. The highly thermal conductive member 40 has a certain degree of the viscosity.

As a result, the highly thermal conductive member 40 does not flow out from the gap between the base portion 12 and the movable portion 7 when it is inclined, for example. As different from a solid matter, the highly thermal conductive member 40 does not prevent the movement of the movable portion 7 or the like constituting the spring stage 6 even if the movable portion 7 is moved by expansion and contraction of the respective piezoelectric actuators 34a and 34b. That is, the gap between the base portion 12 and the movable portion 7 is narrowed or enlarged by the movement of the movable portion 7. At this time, the highly thermal conductive member 40 is just pushed out or expanded from the gap between the base portion 12 and the movable portion 7, and it does not affect the movement of the movable portion 7 at all.

An operation of the apparatus having such a structure will now be described.

When slightly moving the movable portion 7 in the direction of the axis X, a predetermined voltage value is applied to the piezoelectric actuator 34b. The piezoelectric actuator 34b expands or contracts by application of the voltage. For example, when the piezoelectric actuator 34b expands, the arm portion 32d swivels in the clockwise direction with the hinge portion 33d as a supporting point. The drive spring 31d moves in the direction of the axis X with swiveling of the arm portion 32d. As a result, the movable portion 7 slightly moves in the direction of the axis X.

When slightly moving the movable portion 7 in the direction of the axis Y, a predetermined voltage value is applied to the piezoelectric actuator 34a. The arm portion 32a swivels with the hinge portion 33a as a supporting point by the expansion and contraction operation of the piezoelectric actuator 34a caused by the voltage. Concurrently with this, the drive spring 31a moves in the direction of the axis Y. As a result, the movable portion 7 slightly moves in the direction of the axis Y.

Consequently, the CCD 8 mounted on the movable portion 7 slightly moves in the directions X and Y, thereby enabling high-definition imaging based on the image shift.

When the high-definition imaging based on image shift is performed by slightly moving the CCD 8 in the directions X and Y, heat due to imaging is generated from the CCD 8 and the substrate 22 having the CCD 8 mounted thereon.

When a voltage is applied to the cooling element 20, the cooling element 20 cools the CCD 8 through the heat sink 19.

On the other hand, the heat generating surface of the cooling element, i.e., the adjustment screw 21 side is heated. However, the highly thermal conductive member 40 is filled in a gap between the base portion 12 and the movable portion 7. As a result, heat from the heat generating surface of the cooling element 20 is conducted from the movable portion 7 to the highly thermal conductive member 40, and it is further conducted from the base portion 12 to the inner lid 2. This heat is conducted through the movable portion 7, the highly thermal conductive member 40, the base portion 12 and the inner lid 2 like an integral metal.

Further, the base portion 12 and the inner lid 2 other than the movable portion 7 have large heat capacities, and the inner lid 2 is directly fixed to the main body 1 and the upper lid 3. Consequently, heat generated from the cooling element 20 is conducted from the movable portion 7 to the base portion 12 and the inner lid 2, and discharged to the outside of the imaging apparatus housing from the inner lid 2 or the main body 1 and the upper lid 3.

As a result, heat generated from the cooling element 20 is not closed in a space surrounded by the main body 1 and the inner lid 2, thereby sufficiently demonstrating the function of the cooled CCD 8.

As described above, in the first embodiment, the highly thermal conductive member 40 is filled in the gap between the base portion 12 and the movable portion 7 of the spring stage 6 in the pixel shift type imaging apparatus. As a result, heat from the heat generating surface of the cooling element 20 can be conducted from the movable portion 7 to the highly thermal conductive member 40, and it can be further conducted from the base portion 12 to the inner lid 2 and discharged to the outside of the imaging apparatus housing. Consequently, in the imaging apparatus adopting the cooled CCD 8, the CCD 8 can be efficiently cooled.

The base portion 12 and the inner lid 2 other than the movable portion 7 have large heat capacities, and the inner lid 2 is directly fixed to the main body 1 and the upper lid 3. As a result, heat generated from the cooling element 20 can be discharged to the outside of the imaging apparatus housing.

Consequently, heat generated from the cooling element 20 is not closed in a space surrounded by the main body 1 and the inner lid 2, thereby further efficiently cooling the CCD 8.

Therefore, the imaging apparatus adopting the cooled CCD 8 completely seals the main body 1 and the inner lid 2 through the O ring 5 or the like, prevents air around the CCD 8 from being in contact with outside air, and avoids dewing to a change in temperature of the CCD 8 by filling, e.g., a nitrogen gas. Even in the imaging apparatus having such a structure, since heat generated from the cooling element 20 is not closed in a space surrounded by the main body 1 and the inner lid 2, the CCD 8 can be efficiently cooled, thereby avoids dewing.

The highly thermal conductive member 40 has a certain degree of viscosity, and does not prevent the movement of the movable portion 7 or the like constituting the spring state 6 by expansion and contraction of the respective piezoelectric actuators 34a and 34b as different from a solid matter. As a result, the high-speed and high-definition imaging of an image based on the image shift is enabled by slightly moving the CCD 8 by the spring stage 6. Moreover, the highly thermal conductive member 40 is, e.g., a highly thermal conductive grease or a highly thermal conductive gel, and readily commercially available.

The highly thermal conductive member 40 is just filled in the gap between the base portion 12 and the movable portion 7 in the existing spring stage 6. Consequently, the compact and very inexpensive apparatus can be obtained without making a space dedicated to cooling nor requiring a special component.

A second embodiment according to the present invention will now be described with reference to the accompanying drawings. It is to be noted that like reference numerals denote parts equal to those in FIG. 1, thereby eliminating their detailed explanation.

Figure 3:
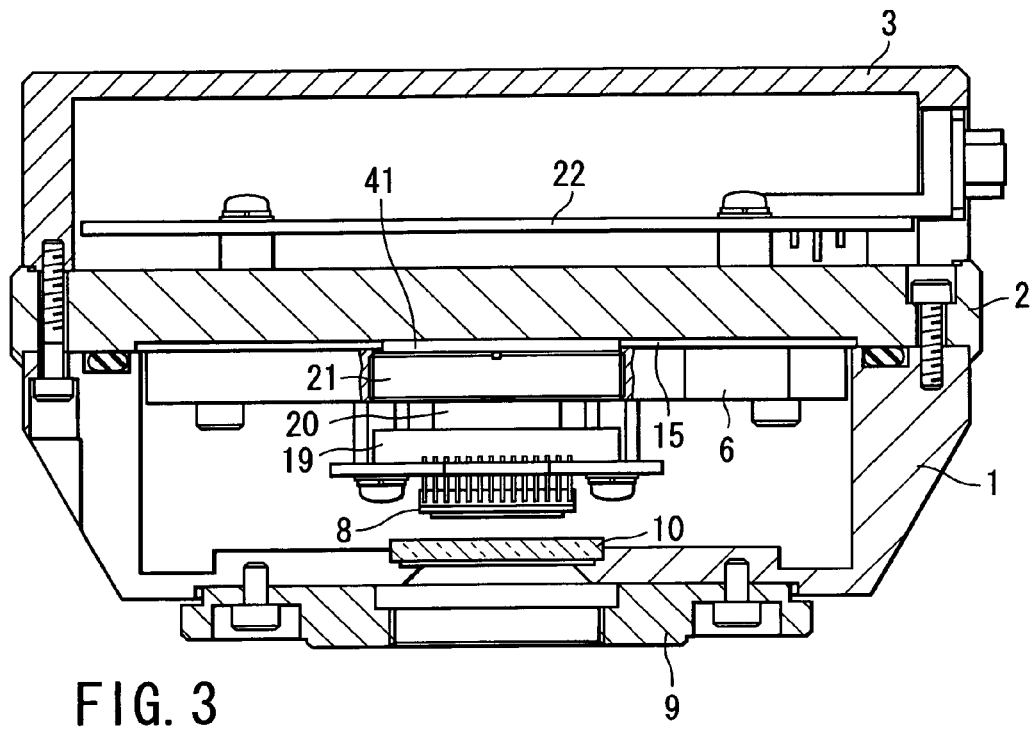
FIG. 3 is an overall block diagram showing a second embodiment of an imaging apparatus according to the present invention.

FIG. 3 is an overall block diagram showing a housing of an imaging apparatus. A highly thermal conductive sheet 41 is provided on an inner lid 2 side of an adjustment screw 21. The highly thermal conductive sheet 41 is a gel type sheet having the appropriate elasticity. The highly thermal conductive sheet 41 is formed into a discoid shape which is the same as that of the adjustment screw 21. The highly thermal conductive sheet 41 has a thickness and a flexibility which do not adversely affect the micro-motion of the movable portion 7 even if a positional relationship between the movable portion 7 and the inner lid 2 is changed in a thickness direction as well as a horizontal direction by the micro-motion of the movable portion 7.

The highly thermal conductive sheet 41 is incorporated into the imaging apparatus housing as follows. A CCD 8, a heat sink 19, and a cooling element 20 are incorporated into a base portion 12. The CCD 8, the heat sink 19 and the cooling element 20 are screwed by the adjustment screw 21 so as to be appressed.

Then, the highly thermal conductive sheet 41 is arranged on the inner lid 2 side of the adjustment screw 21. Subsequently, the inner lid 11 is fixed to a main body 1 by screwing so as to sandwich the highly thermal conductive sheet 41. The highly thermal conductive sheet 41 is set to such a thickness as that it slightly collapses when the highly thermal conductive sheet 41 is fixed between the inner lid 2 and the main body 1.

A recess portion 15 is filled with air. As a result, heat of the heated movable portion 7 cannot be directly released. The highly thermal conductive sheet 41 conducts heat of the movable portion 7 directly to the inner lid 2 by filling an air layer in the recess portion 15.

An operation of the apparatus having such a structure will now be described.

The CCD 8 slightly moves in a direction X and a direction Y by the micro-motion of the movable portion 7, and the high-definition imaging is performed based on the image shift. Heat due to imaging is generated from the CCD 8 and a substrate 22 having the CCD 8 mounted thereon. At this time, when a voltage is applied to the cooling element 20, the cooling element 20 cools the CCD 8 through the heat sink 19.

On the other hand, since the highly thermal conductive sheet 41 is fixed between the inner lid 2 and the main body 1, heat from a heat generating surface of the cooling element 20 is transmitted from the adjustment screw 21 to the highly thermal conductive sheet 41, and it is further conducted to the inner lid 2. Concurrently with this, since the highly thermal conductive sheet 41 fills the air layer of the recess portion 15, heat of the heated movable portion 7 is conducted to the inner lid 2 through the highly thermal conductive sheet 41.

As a result, heat generated from the cooling element 20 is not closed in a space surrounded by the main body 1 and the inner lid 2, and it is discharged to the outside of the imaging apparatus housing from the inner lid 2, the main body 1 and an upper lid 3.

As described above, in the second embodiment, the highly thermal conductive sheet 41 is provided on an inner lid 2 side of the adjustment screw 21 of the movable portion 7. Consequently, heat from the heat generating surface of the cooling element 20 and heat of the heated movable portion 7 can be smoothly conducted to the inner lid 2 through the highly thermal conductive sheet 41, and discharged to the outside of the imaging apparatus housing. Therefore, the function of the cooled CCD 8 can be sufficiently demonstrated, and it does not affect the micro-motion by the pixel shift type spring stage 6.

Since the highly thermal conductive sheet 41 is configured to be fixed between the inner lid 2 and the adjustment screw 21, the imaging apparatus housing can be assembled by a very simple operation. Thus, the number of assembling steps of the imaging apparatus housing can be reduced, thereby decreasing the cost.

The thermal conductivity of the highly thermal conductive sheet 41 is determined by a thickness and a material of the highly thermal conductive sheet 41. Consequently, the highly thermal conductive sheets 41 with the same thermal conductivity can be readily obtained by homogeneously managing the thickness and the material of the highly thermal conductive sheets 41. Accordingly, the highly thermal conductive sheet 41 does not produce irregularities in performance of the thermal conductivity, and can uniformize the performance of heat emission. When a grease is used in place of the highly thermal conductive sheet 41, heat of the movable portion 7 can be likewise smoothly conducted to the inner lid 2 through the grease, and released to the outside of the imaging apparatus housing.

In case of the highly thermal conductive sheet 41, the very inexpensive apparatus can be obtained without making a space dedicated to cooling nor requiring a special component.

A third embodiment according to the present invention will now be described with reference to the accompanying drawings. It is to be noted that like reference numerals denote parts equal to those in FIG. 2, thereby eliminating their detailed explanation.

Figure 4:
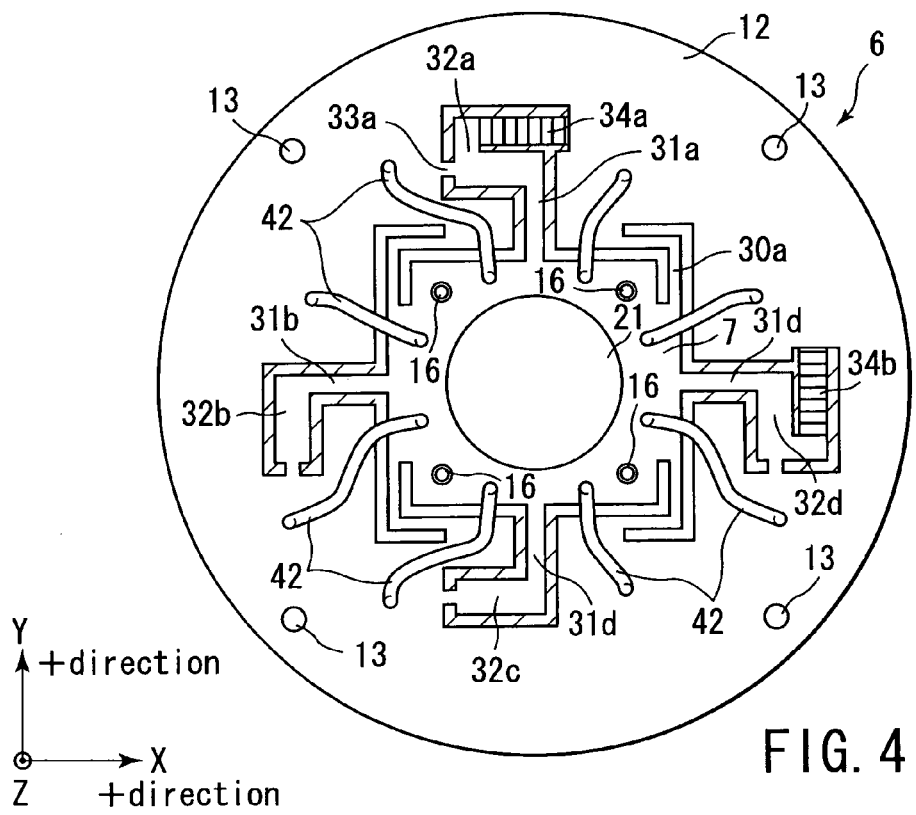
FIG. 4 is a block diagram of a spring stage in a third embodiment of an imaging apparatus according to the present invention.

FIG. 4 is a block diagram of a spring stage in an imaging apparatus. In a spring stage 6, a gap is provided between a base portion 12 and a movable portion 7, and the base portion 12 and the movable portion 7 are connected to each other by a plurality of corded highly thermal conductive members 42 over a gap between these portions.

The corded highly thermal conductive member 42 is formed by, e.g., an elastic body. The corded highly thermal conducive members 42 are connected so as not exert the tension, i.e., so as not to be strained between the base portion 12 and the movable portion 7. Therefore, the corded highly thermal conducive member 42 does not adversely affect the micro-motion operation of the movable portion 7 of the spring stage 6. The shape of the corded highly thermal conductive member 42 is not restricted to a corded shape, and this member may be formed into a zonal shape. Alternatively, the thermal conductivity may be increased by increasing a cross section of this member.

An operation of the apparatus having such a structure will now be described.

The CCD 8 is slightly moved in a direction X and a direction Y by the micro-motion of the movable portion 7, and the high-definition imaging based on the image shift is carried out. At this time, heat due to imaging is generated from the CCD 8 and a substrate 22 having the CCD 8 mounted thereon. When a voltage is applied to a cooling element 20, the cooling element 20 cools the CCD 8 through a heat sink 19.

On the other hand, heat from a heat generating surface of the cooling element 20 is conducted from the movable portion 7 to an inner lid 2 through a plurality of the corded highly thermal conductive members 42.

As a result, heat generated from the cooling element 20 is not closed in a space surrounded by a main body 1 and the inner lid 2, and it is discharged to the outside of the imaging apparatus housing from the inner lid 2, the main body 1 and an upper lid 3.

As described above, in the third embodiment, a plurality of the corded highly thermal conductive members 42 are connected over the gap between the base portion 12 and the movable portion 7 in the spring stage 6. Consequently, like the first embodiment, the function of the cooled CCD can be fully demonstrated. Additionally, since these members are connected so as not to be strained between the base portion 12 and the movable portion 7, the micro-motion by the image shift type spring stage 6 is not affected.

The method of connecting the corded highly thermal conductive members 42 is easy to perform maintenance as compared with the method of filling the highly thermal conductive member 40 in the gap between the base portion 12 and the movable portion 7.

Although a plurality of the corded highly thermal conductive members 42 cut across the gas between the base portion 12 and the movable portion 7, their height is not larger than an installation height of the substrate 17 having the CCD 8 mounted thereon, which does not lead to an increase in a space.

It is to be noted that the present invention is not restricted to the first to third embodiments, and it can be modified in many ways without departing from the scope of the invention on an embodying stage. Another embodiment will now be described hereinafter.

Figure 5:
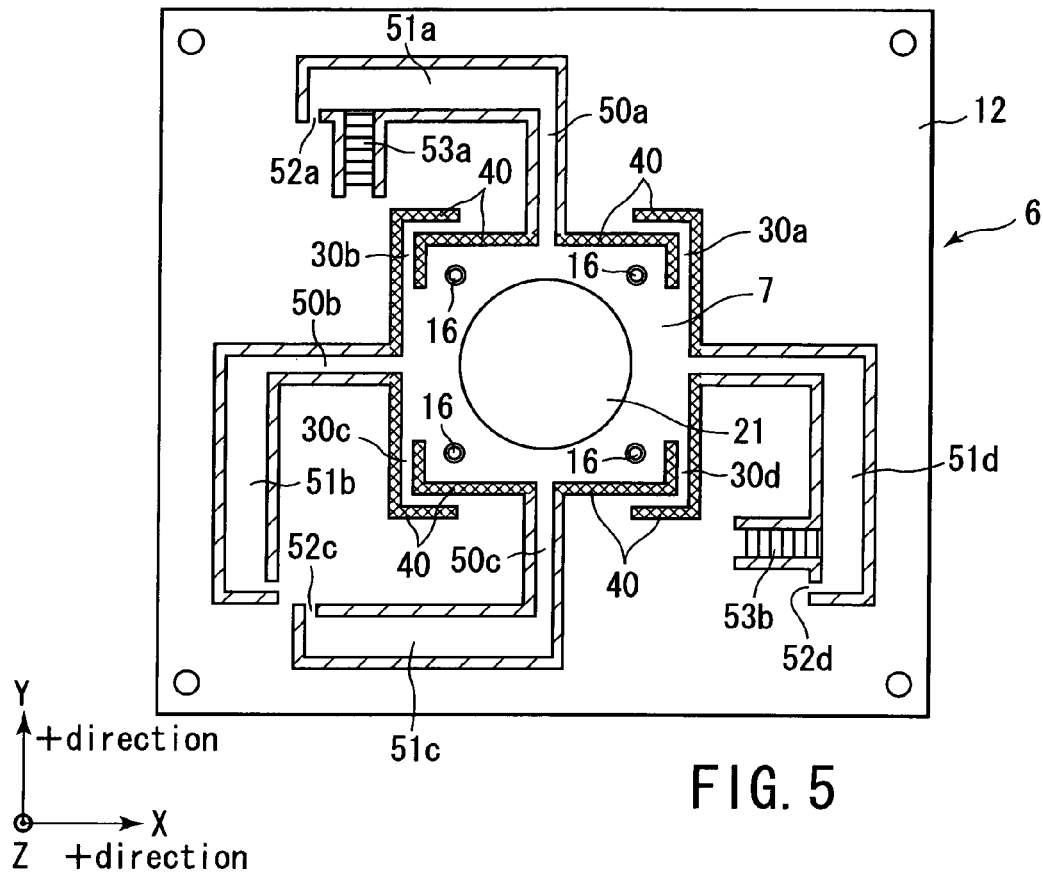
FIG. 5 is a block diagram of a spring stage in another embodiment of the imaging apparatus according to the present invention.

FIG. 5 is a block diagram of a spring stage in an imaging apparatus. It is to be noted that like reference numerals denote parts equal to those in FIG. 1, thereby eliminating the detailed explanation.

Respective drive springs 50*a* to 50*d* are formed on an axis X and an axis Y running through a central part of a movable portion 2. One end of each of arm portions 51*a* to 51*d* is connected to an end portion of each of the drive springs 50*a* to 50*d*. The respective arm portions 51*a* to 51*c* are along a direction of the axis X and formed in substantially parallel. The respective arm portions 51*b* to 51*d* are along a direction of the axis Y and formed in substantially parallel.

A shape that the drive spring 50*a* and the arm portion 51*a* are integrated and a shape that the drive spring 50*c* and the arm portion 51*c* are integrated are axially symmetrical with the axis X at the center. A shape that the drive spring 50*b* and the arm portion 51*b* are integrated and a shape that the drive spring 50*d* and the arm portion 51*d* are integrated are axially symmetrical with the axis Y at the center.

Each of hinge portions 52*a* to 52*d* is formed at the other end portion of each of the arm portions 51*a* to 51*d*. The respective hinge portions 52*a* to 52*d* act as swiveling supporting points of the arm portions 51*a* to 51*d*.

A piezoelectric actuator 53*a* is provided on a side surface of the arm portion 51*a* close to the hinge portion 52*a*. A piezoelectric actuator 53*a* is provided on a side surface of the arm portion 51*a* in a minus (−) direction of the axis Y, and in a plus (+) direction of the axis X away from a position of the hinge portion 52*a*. The piezoelectric actuator 53*a* performs an expansion and contraction operation in the direction of the axis Y. The arm portion 51*a* swivels with the hinge portion 52*a* as the supporting point by the expansion and contraction operation of the piezoelectric actuator 53*a*.

A piezoelectric actuator 53*d* is provided on a side surface of the arm portion 51*d* close to the hinge portion 52*d*. The piezoelectric actuator 53*d* is provided on the side surface of the arm portion 51*d* in a minus (−) direction of the axis X and in a plus (+) direction of the axis Y away from a position of the hinge portion 52*d*. The piezoelectric actuator 53*b* performs an expansion and contraction operation in the direction of the axis X. The arm portion 51*d* swivels with the hinge portion 52*d* as the supporting point by the expansion and contraction operation of the piezoelectric actuator 53*b*.

In case of slightly moving the movable portion 7 in the direction of the axis Y, when a predetermined voltage value is applied to the piezoelectric actuator 53*a*, the piezoelectric actuator 53*a* expands and contracts in the direction of the axis Y. For example, when the piezoelectric actuator 53*a* expands, the arm portion 51*a* swivels with the hinge portion 52*a* as the supporting point in the counterclockwise direction. The drive spring 50*a* slightly moves in the direction of +Y and the movable portion 2 slightly moves in the direction of +Y by swiveling of the arm portion 51*a*.

In case of slightly moving the movable portion 7 in the direction of axis X, when a predetermined voltage value is applied to the piezoelectric actuator 53*b*, the piezoelectric actuator 53*b* expands and contracts in the direction of the axis X. For example, when the piezoelectric actuator 53*b* expands, the arm portion 51*d* swivels with the hinge portion 52*d* as the supporting point in the clockwise direction. The drive spring 50*d* slightly moves in the direction of +X and the movable portion 2 slightly moves in the direction of +X by swiveling of the arm portion 51*d*.

As a result, the CCD 8 mounted on the movable portion 7 slightly moves in the direction of axis X and the direction of the axis Y, thereby enabling the high-definition imaging based on the pixel shift.

A highly thermal conductive member 40 is filled in a gap between a base portion 12 and the movable portion 7 in a spring stage 6. Filling the highly thermal conductive member 40 in this manner can demonstrate the same advantage as that in the first embodiment.

Figure 6:
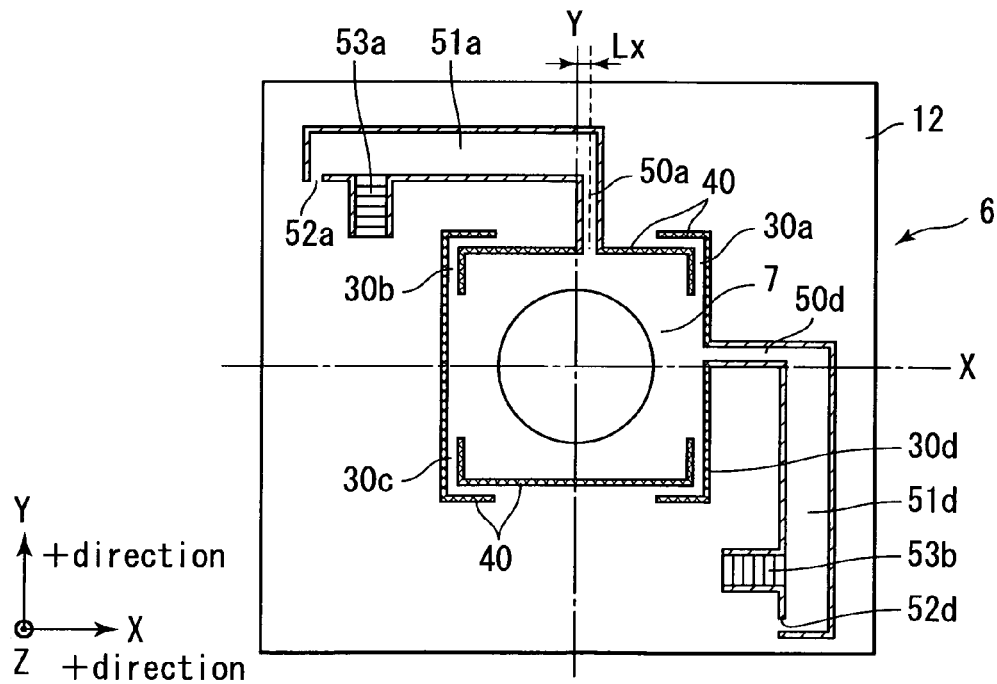
FIG. 6 is a block diagram of a spring stage in still another embodiment of the imaging apparatus according to the present invention.

FIG. 6 is a block diagram of the spring stage in the imaging apparatus. It is to be noted that like reference numerals denote parts equal to those in FIG. 5, thereby eliminating their detailed explanation.

A difference from the spring stage 6 depicted in FIG. 5 lies in that the drive springs 50*b* and 50*c* and the arm portions 51*b* and 51*c* are eliminated and connection positions of the drive springs 50*a* and 50*c* to the movable portion 7 are shifted from the axis Y and the axis Y by distances Lx and Ly, respectively.

The highly thermal conductive member 40 is filled in the gap between the base portion 12 and the movable portion 7. Filling the highly thermal conductive member 40 can demonstrate the same advantage as that in the first embodiment.

Figure 7:
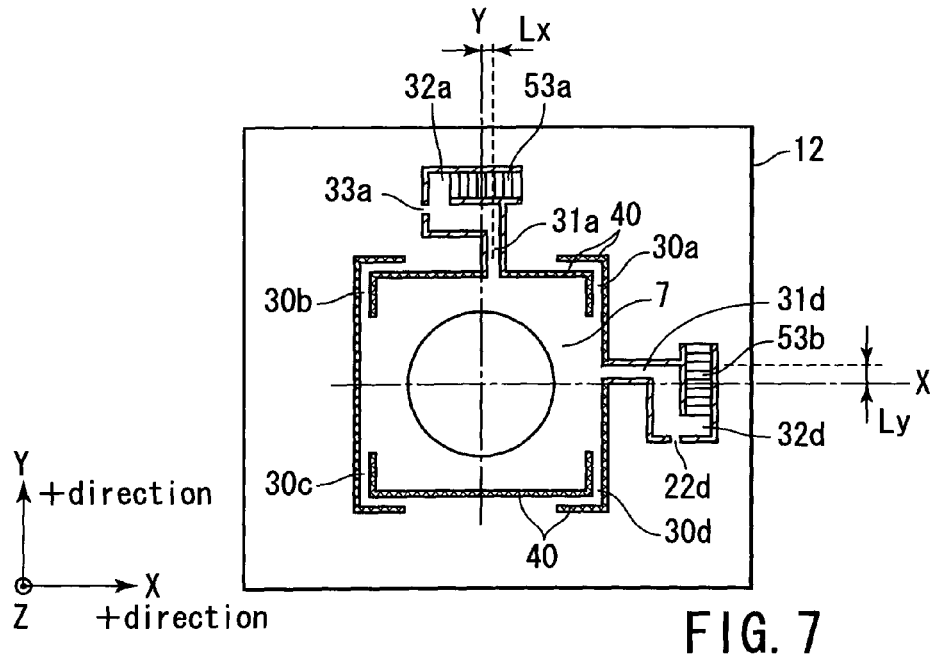
FIG. 7 is a block diagram of a spring stage in yet another embodiment of the imaging apparatus according to the present invention.

FIG. 7 is a block diagram of the springs stage in the imaging apparatus, and like reference numerals denote parts equal to those in FIG. 2, thereby eliminating their detailed description.

A difference from the spring stage 6 shown in FIG. 2 lies in that the drive springs 31*b* and 31*c* and the arm portions 32*b* and 32*c* are eliminated and connection positions of the drive springs 31*a* and 31*d* to the movable portion 7 are shifted from the center by distances Lx and Ly, respectively.

In case of slightly moving the movable portion 7 in the direction of the axis X, when a predetermined voltage value is applied to the piezoelectric actuator 34*b*, the piezoelectric actuator 34*b* expands and contracts in the direction X. As a result, the arm portion 32*d* swivels with the hinge portion 33*d* as the supporting point. With swiveling of the arm portion 32*d*, the drive spring 31*d* moves in the direction of the axis X. Consequently, the movable portion 7 slightly moves in the direction of the axis X. In regard to the direction of the axis Y, likewise, the movable portion 7 slightly moves in the direction of the axis Y practically without the swiveling operation.

In such a spring stage 6, since the highly thermal conductive member 40 is filled in the gap between the base portion 12 and the movable portion 7, the same advantage as that in the first embodiment can be demonstrated.

Figure 8:
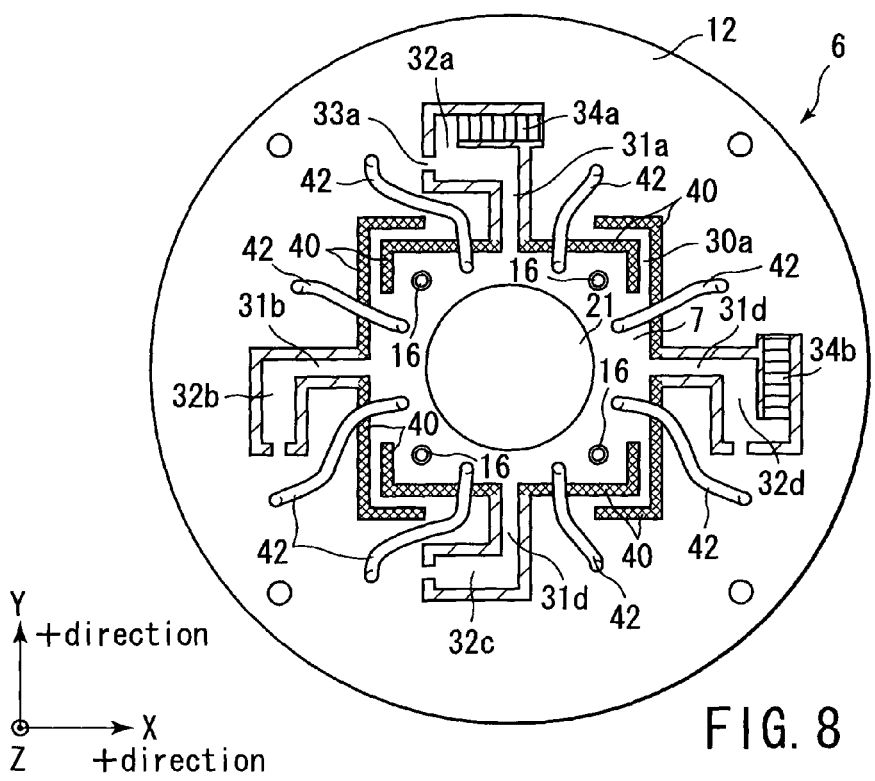
FIG. 8 is a block diagram of a spring stage in a further embodiment of the imaging apparatus according to the present invention.

The highly thermal conductive member 40 is filled in the gap between the base portion 12 and the movable portion 7 in the first embodiment, the highly thermal conductive sheet 41 is provided on the inner lid 2 side of the adjustment screw 21 in the second embodiment, a plurality of corded highly thermal conductive members 42 cut across the gap between the base portion 12 and the movable portion 7 in the third embodiment. However, these embodiments may be combined with each other. For example, the highly thermal conductive member 40 described in connection with the first embodiment may be combined with a plurality of the corded highly thermal conductive members 42 explained in conjunction with the third embodiment as shown in FIG. 8. As a result, heat from the heat generating surface of the cooling element 20 is conducted from the movable portion 7 to the highly thermal conductive member 40, the base portion 12 and the inner lid 2, and emitted from the main body 1 and the upper lid 3 to the outside of the imaging apparatus housing. Further, heat from the heat generating surface of the cooling element 20 is conducted from the movable portion 7 to the inner lid 2 through a plurality of the corded highly thermal conductive members 42, and emitted from the inner lid 2, the main body 1 and the upper lid 3 to the outside of the imaging apparatus housing. Consequently, heat emission can be further improved.

What is claimed is:

1. An imaging apparatus comprising:
   a fixed plate portion;
   a spring portion formed by notching an interior of the fixed portion;
   a movable portion supported in the fixed portion via the spring portion so as to be capable of moving;
   a micro-motion element which moves the movable portion;
   an imaging element which is provided on the movable portion, and which is enabled to perform high-definition imaging due to movement of the movable portion;
   a cooling element having a cooling surface that is in contact with a back side of the imaging element through a heat sink;
   a thermally conductive member interposed in a gap between the fixed portion and the movable portion;
   a housing which accommodates therein the fixed portion, the spring portion, the movable portion, the micro-motion element, the imaging element, the cooling element and the thermally conductive member, and which discharges heat conducted from a heat generating surface of the cooling element through the movable portion and the thermally conductive member;
   wherein the thermally conductive member is pushed out or expanded from the gap between the fixed portion and the movable portion when the gap is narrowed or widened by movement of the movable portion, and the thermally conductive member has a viscosity such that the thermally conductive member does not flow down from the gap between the fixed portion and the movable portion even when inclined.

2. The imaging apparatus according to claim 1, wherein the micro-motion element includes a piezoelectric actuator.

3. The imaging apparatus according to claim 1, wherein the imaging element comprises a CCD which is cooled directly by using the cooling element and the heat sink.

4. The imaging apparatus according to claim 1, wherein the thermally conductive member comprises one of a thermally conductive grease and a thermally conductive gel.

5. The imaging apparatus according to claim 1, wherein the housing is filled with an inert gas.

6. The imaging apparatus according to claim 1, wherein a thermally conductive grease is coated on a contact surface between the imaging element and the heat sink and on a contact surface between the heat sink and the cooling element.

* * * * *